United States Patent
Akamatsu

(10) Patent No.: US 11,152,040 B1
(45) Date of Patent: Oct. 19, 2021

(54) DELAY CALIBRATION OSCILLATORS FOR A MEMORY DEVICE

(71) Applicant: Micron Technology, Inc., Boise, ID (US)

(72) Inventor: Hiroshi Akamatsu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/231,715

(22) Filed: Apr. 15, 2021

Related U.S. Application Data

(63) Continuation of application No. 15/930,133, filed on May 12, 2020, now Pat. No. 11,011,212.

(51) Int. Cl.
  *G11C 8/00* (2006.01)
  *G11C 7/10* (2006.01)
  *G11C 7/22* (2006.01)

(52) U.S. Cl.
  CPC .......... *G11C 7/1003* (2013.01); *G11C 7/1018* (2013.01); *G11C 7/1072* (2013.01); *G11C 7/22* (2013.01); *G11C 2207/2254* (2013.01)

(58) Field of Classification Search
  CPC ....... G11C 7/1003; G11C 7/22; G11C 7/1072; G11C 7/1018; G11C 2207/2254
  See application file for complete search history.

(56) References Cited

U.S. PATENT DOCUMENTS

| 10,305,497 | B2 | 5/2019 | Nakata | |
| 2017/0324405 | A1* | 11/2017 | Martinez | H03K 5/159 |
| 2019/0004562 | A1* | 1/2019 | Gupta | G06F 1/14 |

FOREIGN PATENT DOCUMENTS

WO  2010037815 A2  4/2010

OTHER PUBLICATIONS

ISA/KR, International Search Report and Written Opinion of the International Searching Authority, Int'l Appl. No. PCT/US2021/027618, dated Aug. 6, 2021, Korean Intellectual Property Office, Seo-gu, Daejeon, Republic of Korea, 8pgs.

* cited by examiner

*Primary Examiner* — Uyen Smet
(74) *Attorney, Agent, or Firm* — Holland & Hart LLP

(57) ABSTRACT

Methods, systems, and devices for delay calibration oscillators for a memory device are described. In some examples, a memory device may include a delay chain operable (e.g., for a calibration operation) in a ring oscillator configuration that includes a pulse generator. The pulse generator may be configured to output a pulse signal responsive to a transition of an input signal. By generating a pulse signal in a feedback loop of a ring oscillator, the ring oscillator may support a cycle that does not rely on both a first transition propagation pass (e.g., a rising edge propagation) and a responsive, opposite transition propagation pass (e.g., a falling edge propagation) through the delay chain, which may support a ring oscillator cycle time (e.g., period) that more closely represents aspects of the delay chain that are meant to be calibrated.

20 Claims, 8 Drawing Sheets

DELAY CALIBRATION OSCILLATORS FOR A MEMORY DEVICE

CROSS REFERENCE

The present Application for Patent is a continuation of and claims priority to and the benefit of U.S. patent application Ser. No. 15/930,133 by Akamatsu, entitled "DELAY CALIBRATION OSCILLATORS FOR A MEMORY DEVICE," filed May 12, 2020, now U.S. Pat. No. 11,011,212, issued Mar 18, 2021, assigned to the assignee hereof, and is expressly incorporated by reference in its entirety herein.

BACKGROUND

The following relates generally to one or more memory systems and more specifically to delay calibration oscillators for a memory device.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Figure 1:
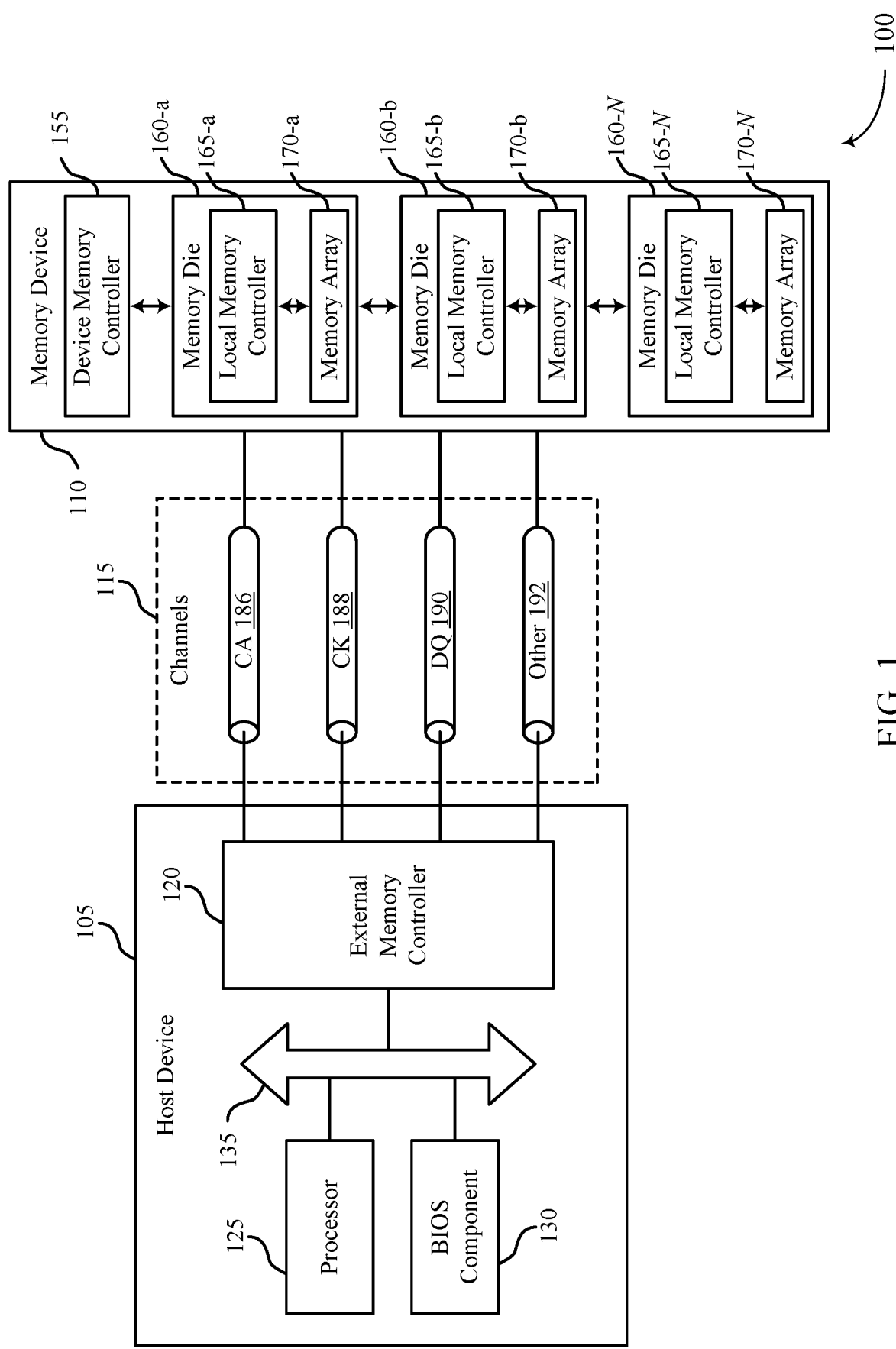
FIG. 1 illustrates an example of a system that supports delay calibration oscillators for a memory device in accordance with examples as disclosed herein.

In some memory devices, accessing memory cells may involve various operations controlled by respective timing signals, which may be triggered or initiated by an input signal (e.g., an access command, an access trigger). To support operations being performed according to a desired relative timing, a memory device may include one or more delay chains, each having a respective set of delay components configured for generating timing signals according to the desired timing. Such timing signals generated by delay components may be referred to as asynchronous timing signals, and may have transitions (e.g., rising edges, falling edges) that are delayed by one or more delay components relative to a transition of an input signal.

A delay component may include various circuit elements that impose a delay between a transition of an input signal and a corresponding transition of an output signal. For example, a delay component may include one or more gate delays or gate delay components, which may be associated with a duration between an input signal of the component crossing a threshold voltage and an output signal of the component crossing the threshold voltage. A delay component may also include other types of passive or active delay elements such as resistors, capacitors, current sources, and the like. In some examples, delay components may have timing characteristics that are sensitive to fabrication variability (e.g., process variability) or operating condition variability (e.g., voltage variability, temperature variability), such that asynchronous timing signals may also be affected by such variability. In various examples, a variability of asynchronous timing signals may be associated with adverse performance of a memory device, or a variability of asynchronous timing signals may be advantageously used to adjust access operation timing at different operating conditions. Thus, a memory device may include delay components that are configurable for adjusting a nominal delay duration, or a variability of a delay duration (e.g., a slope relative to temperature, voltage, or other parameter), among other configurability.

In some examples, a delay chain of a memory device may be operable in a ring oscillator configuration, which may support various aspects of a delay calibration operation. For example, a delay chain may be operated in a calibration mode where the ring oscillator configuration is cycled, and a counter is used to count a quantity of cycles of the ring oscillator over a calibration duration. In some examples, a ring oscillator configuration may be supported by including an inverter in a feedback loop of the delay chain, such that each pass through the delay chain is associated with an alternation between a rising edge propagation and a falling edge propagation. Thus, a cycle of a ring oscillator signal may be associated with two passes through the delay chain, such as a first pass corresponding to a rising edge propagation and a second pass, responsive to or otherwise following the first pass, corresponding to a falling edge propagation. However, in some examples, aspects of falling edge delays of the delay chain may be different than aspects of rising edge delays of the delay chain (or vice versa), and may be less relevant to a desired timing signal generation. Thus, cycling a delay chain ring oscillator in such a configuration may have limitations for calibrating the delay chain relative to desired access operation timing.

In accordance with examples as disclosed herein, a memory device may include a delay chain operable in a ring oscillator configuration that includes a pulse generator. The pulse generator may be configured to generate an output signal having a first transition, followed by a second transition (e.g., an opposite transition), responsive to a transition of an input signal, which may be an example of generating a pulse signal responsive to the transition of the input signal. By generating a pulse signal in a feedback loop of a ring oscillator, the ring oscillator may support a cycle that does not rely on both a first signal propagation pass and a responsive, opposite signal propagation pass through the delay chain. Rather, a ring oscillator configuration that includes a pulse signal generation may support a cycle using a single signal propagation pass through the delay chain, which may support a ring oscillator cycle time (e.g., period) that is more closely representative of a duration of the delay chain that is meant to be calibrated (e.g., a rising edge delay calibration). Accordingly, by including a pulse generator in a ring oscillator configuration of a delay chain, a memory device may support improved calibration of relevant delay durations.

Features of the disclosure are initially described in the context of memory systems and dies as described with reference to FIGS. 1-2. Features of the disclosure are described in the context of access operation timing diagrams, delay components and related circuitry, and ring oscillator signaling as described with reference to FIGS. 3-6. These and other features of the disclosure are further illustrated by and described with reference to an apparatus diagram and a flowchart that relate to delay calibration oscillators for a memory device as described with reference to FIGS. 7 and 8.

FIG. 1 illustrates an example of a system 100 that supports delay calibration oscillators for a memory device in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, accessing memory cells of a memory array 170 may involve various operations controlled by respective timing signals, which may be triggered or initiated by an input signal (e.g., an access command received from a host device 105 or generated at the memory device 110). To support operations being performed according to a desired relative timing, a memory device 110 (e.g., a device memory controller 155, a local memory controller 165) may include one or more delay chains, each having a respective set of delay components configured for generating timing signals according to the desired timing. Such timing signals generated by delay components may be referred to as asynchronous timing signals (e.g., asynchronous with a clock signal, such as a clock signal conveyed over a CK channel or a clock signal generated at a memory device 110 or memory die 160), and may have transitions (e.g., rising edges, falling edges) that are delayed by one or more delay components relative to a transition of an input signal.

A delay component may include various circuit elements that impose a delay between a transition of an input signal and a corresponding transition of an output signal. In some examples, delay components may have timing characteristics that are sensitive to fabrication variability (e.g., process variability) or operating condition variability (e.g., variability of a voltage supply from a host device 105, variability of a voltage regulator of a memory device 110 or memory die 160, operating or environmental temperature variability experienced by a memory device 110), such that asynchronous timing signals may also be affected by such variability. In some cases, the variability of asynchronous timing signals may be associated with adverse performance of the memory device 110, or the system 100 as a whole, including reduced read margins, increased read or write errors, longer latency to support timing or signaling uncertainties, and others. In some cases, the variability of asynchronous timing signals may be advantageously used to adjust delays between timing signals to compensate for physical phenomenon relevant to accessing memory cells, such as changes in resistivity, changes in carrier mobility, or changes in signal development characteristics at different operating conditions. Thus, a memory device 110 or memory die 160 may include delay components that are configurable for adjusting a nominal delay duration, or a variability of a delay duration (e.g., a slope relative to temperature, voltage, or other parameter), among other configurability. In accordance with examples as disclosed herein, a memory device 110 or memory die 160 may include a delay chain operable in a ring oscillator configuration that includes a pulse generator, which may support improved calibration of relevant delay durations.

Figure 2:
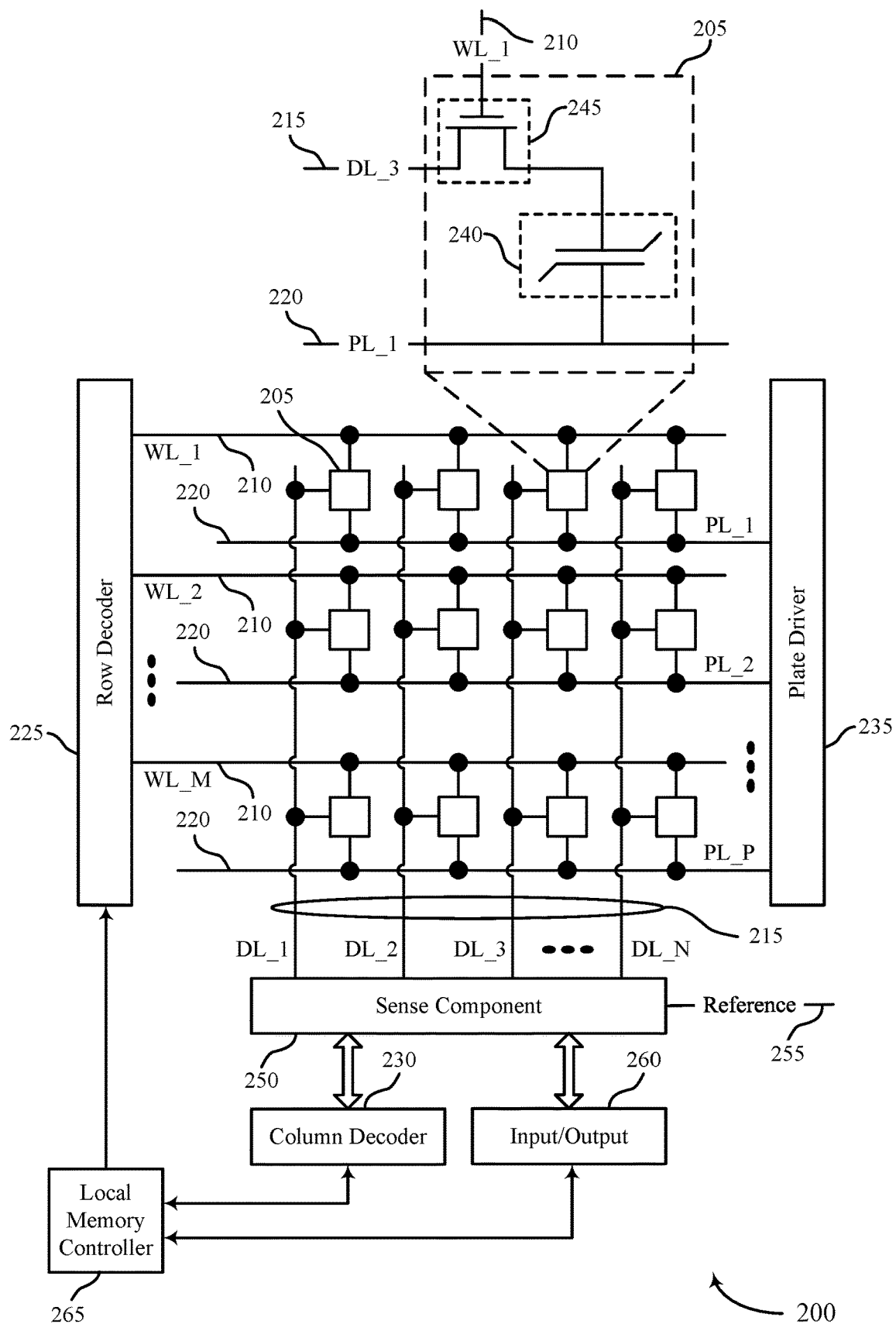
FIG. 2 illustrates an example of a memory die that supports delay calibration oscillators for a memory device in accordance with examples as disclosed herein.

FIG. 2 illustrates an example of a memory die 200 that supports delay calibration oscillators for a memory device in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a state (e.g., polarization state or dielectric charge) representative of the programmable states in a capacitor. In FeRAM architectures, the memory cell 205 may include a capacitor 240 that includes a ferroelectric material to store a charge and/or a polarization representative of the programmable state. The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be operable to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be operable to selectively couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may cooperate with the digit line 215 to bias the capacitor 240 during access operation of the memory cell 205.

The sense component 250 may determine a state (e.g., a polarization state or a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage). The detected logic state of the memory cell 205 may be provided as an output of the sense component 250 (e.g., to an input/output 260), and may indicate the detected logic state to another component of a memory device 110 that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a write operation (e.g., a programming operation) on one or more memory cells 205 of the memory die 200. During a write operation, a memory cell 205 of the memory die 200 may be programmed to store a desired logic state. The local memory controller 265 may identify a target memory cell 205 on which to perform the write operation. The local memory controller 265 may identify a target word line 210, a target digit line 215, and a target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The local memory controller 265 may apply a specific signal (e.g., write pulse) to the digit line 215 during the write operation to store a specific state (e.g., charge) in the capacitor 240 of the memory cell 205. The pulse used as part of the write operation may include one or more voltage levels over a duration.

The local memory controller 265 may be operable to perform a read operation (e.g., a sense operation) on one or more memory cells 205 of the memory die 200. During a read operation, the logic state stored in a memory cell 205 of the memory die 200 may be determined. The local memory controller 265 may identify a target memory cell 205 on which to perform the read operation. The local memory controller 265 may identify a target word line 210, a target digit line 215, and target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The target memory cell 205 may transfer a signal to the sense component 250 in response to biasing the access lines. The sense component 250 may amplify the signal. The local memory controller 265 may activate the sense component 250 (e.g., latch the sense component) and thereby compare the signal received from the memory cell 205 to the reference 255. Based on that comparison, the sense component 250 may determine a logic state that is stored on the memory cell 205.

In some examples, accessing memory cells 205 may involve various operations controlled by respective timing signals, which may be triggered or initiated by an input signal. To support operations being performed according to a desired relative timing, a local memory controller 265, or other component of the memory die 200, may include one or more delay chains, each having a respective set of delay components configured for generating timing signals according to the desired timing. Such timing signals may be referred to as asynchronous timing signals, and may have transitions that are delayed by one or more delay components relative to a transition of an input signal. The memory die 200 may include delay components that are configurable for adjusting a nominal delay duration, or a variability or sensitivity of a delay duration to an operating condition (e.g., a slope relative to temperature, voltage, or other parameter), among other configurability.

A delay chain of the memory die 200 may be operable in a ring oscillator configuration, which may support various aspects of a delay calibration operation. For example, a delay chain may be operated in a calibration mode where the ring oscillator configuration is cycled, and a counter (e.g., of the memory die 200, or a memory device that includes the memory die 200, of a calibration component that is included in or is separate from the memory die 200) is used to count a quantity of cycles of the ring oscillator over a calibration duration. The ring oscillator may include a pulse generator configured to generate an output signal having a first transition, followed by a second transition (e.g., an opposite transition), which may be responsive to a single transition of an input signal. By generating a pulse signal in a feedback loop of a ring oscillator, the ring oscillator may support a cycle using a single signal propagation pass through the delay chain, which may support a ring oscillator cycle time (e.g., period) that is more closely representative of a duration of the delay chain that is meant to be calibrated (e.g., to support a rising edge delay calibration).

Figure 3A:
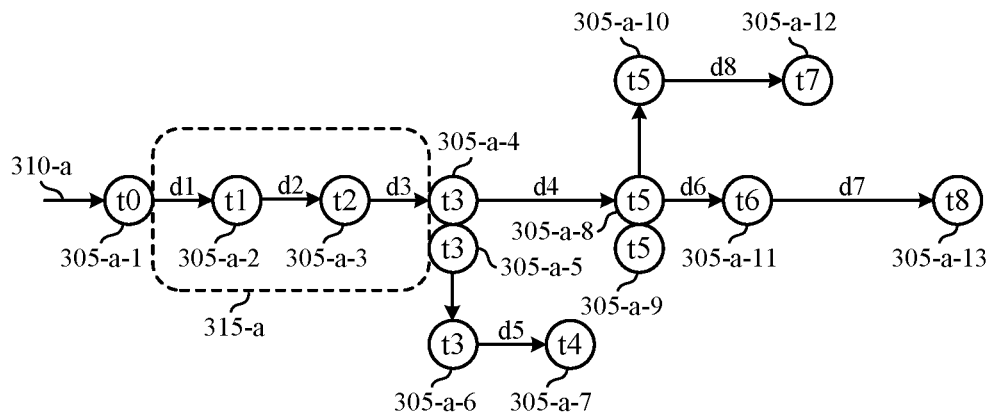
FIGS. 3A and 3B illustrate examples of timing chains that support delay calibration oscillators for a memory device in accordance with examples as disclosed herein.
Figure 3B:
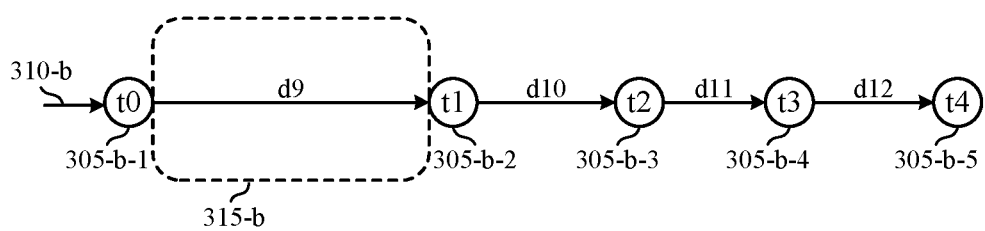

FIGS. 3A and 3B illustrate examples of timing chains 300-a and 300-b, respectively, that support delay calibration oscillators for a memory device in accordance with examples as disclosed herein. The timing chains 300-a and 300-b may be examples of timing chains that support different types of access operations at a memory device 110, and may be illustrative of a simplified chain of delay lines. For example, timing chain 300-a may illustrate aspects of an activation operation or read operation (e.g., in response to an activation command, such as an ACT command, received from a host device 105, as a row address strobe delay chain), and timing chain 300-b may illustrate aspects of a precharge operation or write-back operation (e.g., in response to a precharge command, such as a PRE command, received from a host device 105). The timing chains 300-a and 300-b are for illustrative purposes, and a memory device 110 may be configured with timing chains 300 for activation operations or precharge operations that are configured differently, and a memory device 110 may be configured to support any quantity of timing chains 300 that support various different types of access operations.

Each of the timing chains 300-*a* and 300-*b* include respective operations 305 (e.g., stages) that may be performed in response to an input signal 310 (e.g., an access command. an access operation initiation signal). A respective first operation 305 may be performed or initiated at an initial time after or concurrently with receiving an input signal 310, which may be denoted as a time t0 for a given timing chain. Other operations 305 may performed or initiated at times that are later than t0 (e.g., delayed times), which may support a completion of an operation 305 itself, or a duration for allowing a signal of an operation 305 to stabilize, among other purposes. For example, the operations 305-*a* of the timing chain 300-*a* may be performed or initiated according to delays d1 through d8, relative to the performing or initiating of preceding operations 305-*a*. The operations 305-*b* of the timing chain 300-*b* may be performed or initiated according to delays d9 through d12, relative to the performing or initiating of preceding operations 305-*b*.

In one example, an access operation corresponding to the timing chain 300-*a* may include thirteen sub-operations or stages (e.g., operations 305-*a*-1 through 305-*a*-13) that are performed in response to an access command (e.g., associated with the input signal 310-*a*). In an example where the access operation corresponding to the timing chain 300-*a* is an activation operation or other read operation, the operations 305-*a* may include such operations as opening a row of memory cells 205, activating a word line 210, activating a column of memory cells 205 or otherwise selecting a column of memory cells 205 by a column decoder 230, biasing a plate line 220 or otherwise activating a plate line 220 (e.g., via a plate driver 235), charging or boosting an amplification capacitor or otherwise activating signal development circuitry that supports detecting a logic state stored by a memory cell 205, conveying a developed signal to a sense amplifier (e.g., of a sense component 250), isolating a sense amplifier from signal or reference lines, or latching a result of a comparison at a sense amplifier, among other operations that may support an activation or other read operation. Other examples where the access operation corresponding to a timing chain 300 is an activation operation or other read operation may have more or fewer than thirteen operations.

In another example, an access operation corresponding to the timing chain 300-*b* may include five sub-operations or stages (e.g., operations 305-*b*-*a* through 305-*b*-5) that are performed in response to an access command (e.g., associated with the input signal 310-*b*). In an example where the access operation corresponding to the timing chain 300-*b* is a precharge operation or other write operation, the operations 305-*b* may include such operations as biasing a digit line 215 or otherwise activating a digit line 215 (e.g., via a column decoder 230), biasing a plate line 220 or otherwise activating a plate line 220 (e.g., via a plate driver 235), deactivating a word line 210, closing a row of memory cells 205, or decoupling or idling voltage sources or other components of a memory die, among other operations that may support an activation or other read operation. Other examples where the access operation corresponding to a timing chain 300 is a precharge operation or other write operation may have more or fewer than five operations.

To support the timing or sequence of operations 305 of a timing chain 300, a memory die 200 may generate timing signals corresponding to each of the operations 305 and intervening delays. The timing signals for the operations 305 of a timing chain 300 may refer to a rising edge of an initiation signal, a falling edge of an initiation signal, or some other transition or signal state. Timing signals may be generated based at least in part on delay chain corresponding to a respective timing chain 300 and having a set of delay components that delay a transition of an output signal relative to a transition of an input signal (e.g., a delay between a rising edge of an input signal and a rising edge of an output signal, a delay between a falling edge of an input signal and a falling edge of an output signal). For example, the timing chain 300-*a* may be associated with a corresponding delay chain, where a first set of one or more delay components may be associated with generating a timing signal for initiating operation 305-*a*-2 with a delay, d1, relative to the timing signal or initiation of operation 305-*a*-1, a second set of one or more delay components may be associated with generating a timing signal for initiating operation 305-*a*-3 with a delay, d2, relative to the timing signal or initiation of operation 305-*a*-2, and so on. The timing chain 300-*b* may be associated with a corresponding delay chain that is different than the delay chain for the timing chain 300-*a*, where a first set of one or more delay components may be associated with generating a timing signal for initiating operation 305-*b*-2 with a delay, d9, relative to the timing signal or initiation of operation 305-*b*-1, a second set of one or more delay components may be associated with generating a timing signal for initiating operation 305-*b*-3 with a delay, d10, relative to the timing signal or initiation of operation 305-*b*-2, and so on.

In some examples, access operations performed by the memory die 200 may have a temperature dependence that causes certain supporting operations to take a longer or shorter duration to complete based on a relevant temperature. For example, resistance of an access line (e.g., a word line 210, a digit line 215, a plate line 220) may increase with temperature, such that charge transfer or current flow via an access line may be slower or otherwise reduced at relatively higher temperatures and faster or otherwise increased at relatively lower temperatures. In another example, carrier mobility of a transistor may decrease with temperature, such that charge transfer or current flow across the transistor (e.g., drain current) may be slower at relatively higher temperatures and faster at relatively lower temperatures. Additionally or alternatively, decreased carrier mobility may be associated with a relatively slower activation of a conductive path through the transistor (e.g., relatively slower switching, relatively longer activation time constant), such that charge transfer or current flow across the transistor may develop more slowly at relatively higher temperatures and more quickly at relatively lower temperatures. In some examples, signal development operations associated with accessing a memory cell may be dependent on operating temperature. For example, a ferroelectric memory cell architecture may support relatively faster or stronger development of read signals at elevated temperatures, and therefore a read signal development duration may be configured to be relatively shorter at higher temperatures. In another example, a material memory cell architecture may support relatively faster changes in material state at elevated temperatures, and therefore a write duration may be configured to be relatively shorter at higher temperatures. Accordingly, for these or other reasons, the memory die 200 may be configured to perform different portions of an access operation according to a condition-dependent duration, which may be supported by delay components that are operable based at least in part on a relevant operating condition (e.g., supporting temperature-dependent delay durations, voltage-dependent delay durations). In some examples, a delay component may be configured to minimize or eliminate variability of a delay duration in response to changes in operating conditions.

In some examples, a memory die 200 may employ delay components that support a delay or duration that is proportional to temperature (e.g., directly proportional to temperature, proportional to absolute temperature (PTAT)) to generate timing signals of a timing chain 300. PTAT delay components may be suitable to support the timing of some portions of an access operation, such as those portions of an access operation that are affected by an increase in resistance with increased temperature, a reduction in transistor carrier mobility with increased temperature, and other phenomena. In such examples, a PTAT delay component may support a relatively longer duration for a portion of an access operation at a relatively higher temperature, and a relatively shorter duration for the portion of the access operation at a relatively lower temperature. Although PTAT delay components may support access operation durations that are proportional to temperature (e.g., according to a duration=k*Temperature relationship), PTAT delay components may generally be configured to support a respective first delay at a first temperature and a respective second delay, longer than the first duration, at a second temperature that is higher than the first temperature. Such a delay component may have any relevant positive correlation with temperature In some examples, a memory die 200 may employ delay components that support a delay or duration that is inversely proportional to temperature (e.g., complementary to absolute temperature (CTAT)) to generate timing signals of the memory die 200. CTAT delay components may be suitable to support the timing of some portions of an access operation, such as those portions of an access operation that occur more quickly at elevated temperatures (e.g., a signal development portion of a read operation performed on a ferroelectric memory cell). In such examples, a CTAT delay component may support a relatively shorter duration for a portion of an access operation at a relatively higher temperature, and a relatively longer duration for the portion of the access operation at a relatively lower temperature. Although CTAT delay components may support access operation durations that are inversely proportional to temperature (e.g., according a duration=k/Temperature relationship), CTAT delay components may generally be configured to support a respective first delay at a first temperature and a respective second delay, shorter than the first duration, at a second temperature that is higher than the first temperature. Such a delay component may have any relevant inverse or negative correlation with temperature.

A delay chain corresponding to a timing chain 300, or some portion thereof, may be operable in a ring oscillator configuration, which may support various aspects of a timing signal or delay calibration operation. For example, a set of one or more delay components associated with the delays d1, d2, and d3 of the timing chain 300-a may be associated with a first calibration chain 315-a, and a set of one or more delay components associated with the delay d9 of the timing chain 300-b may be associated with a second calibration chain 315-b. In accordance with examples as disclosed herein, a delay chain corresponding to the calibration chain 315-a or the calibration chain 315-b may be operated in a ring oscillator configuration that includes a pulse generator, which may support a ring oscillator cycle time (e.g., period) that is more closely representative of a duration of the delay chain that is meant to be calibrated (e.g., a rising edge delay duration).

In some examples, the durations of the delays d1, d2, d3, d8, and d12 may be proportional to temperature, as supported by corresponding PTAT delay components. Thus, the first calibration chain 315-a may be a PTAT calibration chain 315 that supports the calibration of any one or more PTAT delay components associated with the timing chain 300-a or the timing chain 300-b, including but not limited to PTAT delay components corresponding to the delays d1, d2, and d3. In other words, in some examples, a PTAT calibration chain 315-a may be used to calibrate delay components corresponding to any one or more of delays d1, d2, d3, d8, and d12. In some examples, other delays (e.g., delays d4 through d7) may be inversely proportional to temperature, as supported by corresponding CTAT delay components, which may be calibrated based at least in part on a CTAT calibration chain 315.

In some examples, the duration of the delay d9 may be inversely proportional to temperature, as supported by CTAT delay components. Thus, the second calibration chain 315-b may be a CTAT calibration chain 315 that supports the calibration of any one or more CTAT delay components associated with the timing chain 300-a or the timing chain 300-b, including but not limited to CTAT delay components corresponding to the delay d9. In some examples, other delays (e.g., delays d10 through d12) may be proportional to temperature, as supported by corresponding PTAT delay components, which may be calibrated based at least in part on a PTAT calibration chain 315 (e.g., PTAT calibration chain 315-a).

Figure 4:
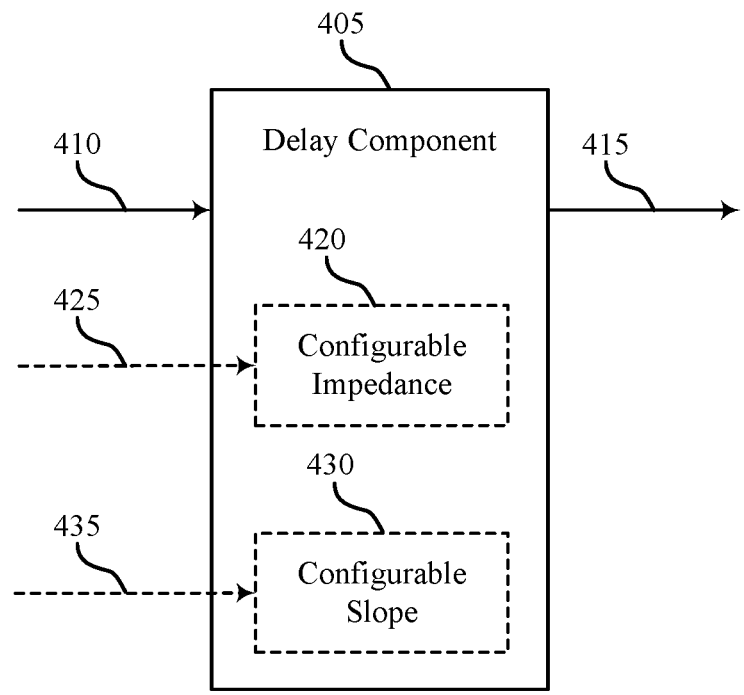
FIG. 4 illustrates an example of a delay component that supports delay calibration oscillators for a memory device in accordance with examples as disclosed herein.

FIG. 4 illustrates an example of a delay component 405 that supports delay calibration oscillators for a memory device in accordance with examples as disclosed herein. The delay component 405 may be included in a set of one or more delay components 405 in a delay chain, which may correspond to one or more timing chains 300 for operating a memory die 200. The delay component 405 may generate an output signal 415 having a transition that is delayed relative to a transition of an input signal 410. For example, at some duration (e.g., a delay duration) after receiving a rising or falling edge of an input signal 410, the delay component 405 may generate a rising or falling edge of an output signal 415. In some cases, an output signal 415 may be provided to one or more components of a memory die 200 to support initiating an operation 305 or stage of an access operation. Additionally or alternatively, in some cases, an output signal 415 may be provided to another delay component 405 in a delay chain (e.g., as an input signal 410 to the other delay component 405), to support a memory die 200 accumulating a delay between operations 305, or for a subsequent operation 305.

A delay duration of the delay component 405 may be based at least in part on a time constant or other delay property of passive circuit elements of the delay component 405, one or more of which may be configurable (e.g., in response to or otherwise based at least in part on a calibration or configuration operation). The delay component 405 may support various techniques for configurable delay durations. In one example, the delay component 405 may include a configurable impedance 420, which may support adjusting a nominal or baseline delay duration. Additionally or alternatively, the delay component 405 may include a configurable slope 430, which may support adjusting a slope or other relationship between a delay duration and an operating condition, such as adjusting a slope or other variability of delay versus temperature, or adjusting a slope or other variability of delay versus operating voltage, among other adjustments.

The calibration or configuration of the delay component 405 may be supported by various signaling or programming techniques. For example, the delay component 405 may be provided with one or both of an impedance calibration signal 425 or a slope calibration signal. In some examples, the configurable impedance 420 may include a set of selectable elements or otherwise configurable elements, where the elements may include resistors, capacitors, or current sources. The impedance calibration signal 425 may be used to adjust a time constant behavior of the configurable impedance 420 that shortens or lengthens a delay duration by selectively adjusting the configurable impedance(s). In another example, the configurable slope 430 may include a network of transistors, and the slope calibration signal 435 may be applied to gates of at least a subset of the transistors to modify an operating point or condition (e.g., in a linear or saturation region) of the subset of transistors to increase or decrease a sensitivity (e.g., proportionality) of the delay component 405 to operating temperature or operating voltage. In another example, the configurable slope 430 may include an array of transistors operating in a parallel arrangement, and the slope calibration signal 435 may be applied to selectively enable or disable signal paths through one or more transistors of the array to modify a net conductivity through the array to increase or decrease a sensitivity (e.g., inverse proportionality) of the delay component 405 to operating temperature or operating voltage.

The impedance calibration signal 425 or the slope calibration signal 435 may support various techniques of configurability. In one example, one or both of the impedance calibration signal 425 or the slope calibration signal 435 may be provided as a code signal of one or more bits, which may be provided by a central controller (e.g., a local memory controller 265, a device memory controller 155) that stores or accesses calibration parameters (e.g., trim parameters, as set or defined during a calibration operation, which may be one example of storing a configuration for one or more delay components 405). In another example, one or both of the impedance calibration signal 425 or the slope calibration signal 435 may refer to a one-time programming signal that sets a state of one or more fuses or anti-fuses at the configurable impedance 420 or the configurable slope 430, which may be another example of storing a configuration for one or more delay components 405. In another example, such fusing or anti-fusing may be performed at a local memory controller 265 or a device memory controller 155, and may be used to support signaling provided to the delay component 405.

In some examples, a delay component 405 may be configured to have a delay duration for one transition direction that is different than a delay duration in another transition direction. For example, a delay between rising edges of an input signal 410 and an output signal 415 may be relatively longer than a delay between falling edges of an input signal 410 and an output signal. In some cases, a delay between rising edges may be based on a time constant behavior (e.g., related to a resistance and capacitance (RC) impedance), and a delay between falling edges may be based on a transistor gate behavior (e.g., a quantity of gate delays). In some cases, a delay between rising edges may be configurable separately from a delay between falling edges. For example, delays between rising edges may dictate initiation timing of operations 305, whereas delays between falling edges may not dictate initiation timing of operations 305. Accordingly, calibrating falling edge delays may not be critical, such that a delay component 405 may be configured to support a calibration of rising edge delays, but not a calibration of falling edge delays.

Figure 5:
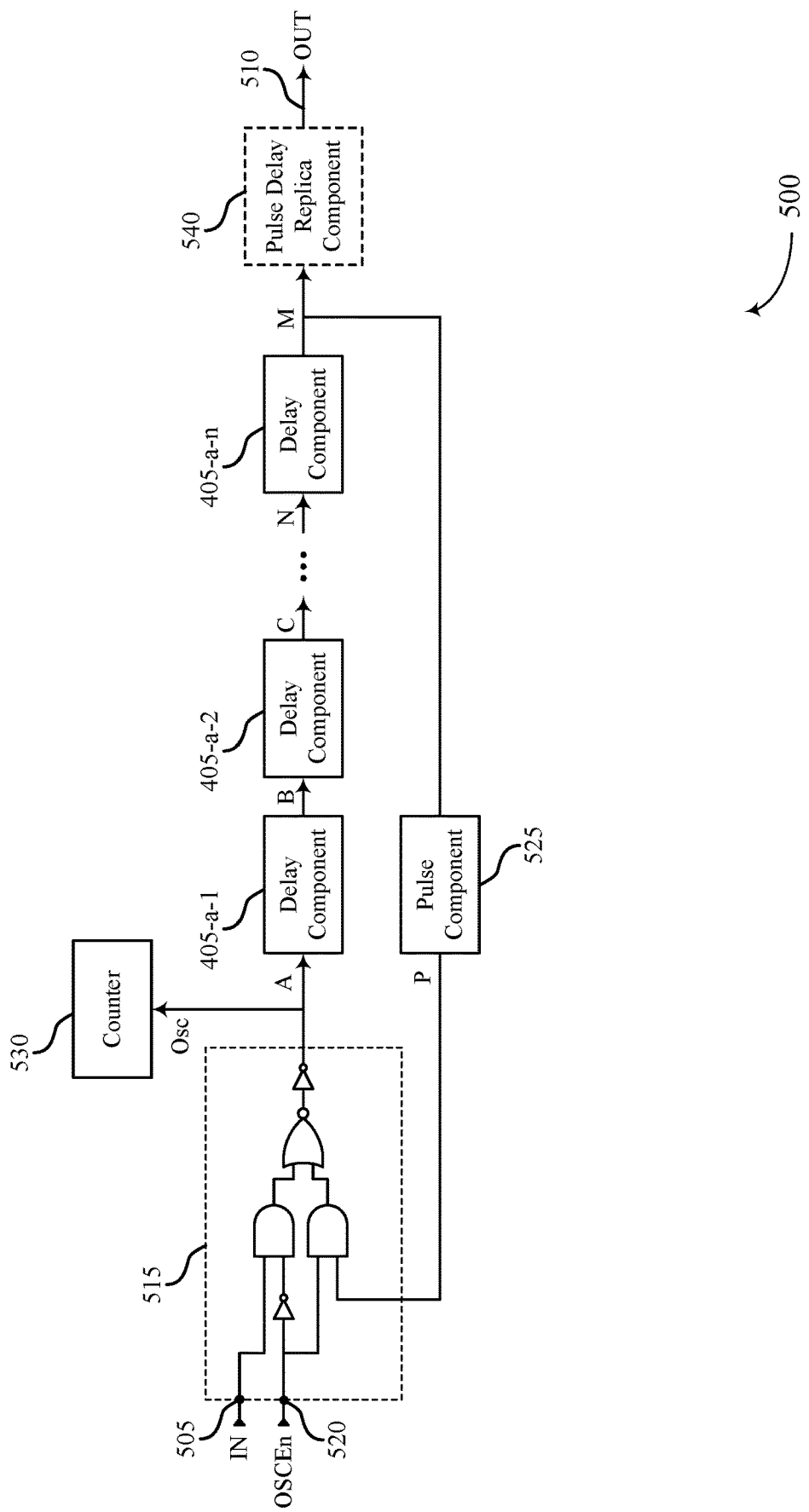
FIG. 5 illustrates an example of a delay chain that supports delay calibration oscillators for a memory device in accordance with examples as disclosed herein.

FIG. 5 illustrates an example of a delay chain 500 that supports delay calibration oscillators for a memory device in accordance with examples as disclosed herein. The delay chain 500 includes a set of delay components 405-a that may support the generation of timing signals for accessing a memory array 170. In some examples, the delay chain 500 may correspond to a calibration chain 315 as described with reference to FIG. 3A or 3B, and accordingly may be associated with a subset of operations 305 of a timing chain 300 for an access operation (e.g., an ACT operation, a PRE operation). The delay chain 500 may correspond to a PTAT calibration chain 315 or a CTAT calibration chain 315.

The delay chain 500 includes a set of N delay components 405-a, but a delay chain 500 in accordance with disclosed examples may include any quantity of one or more delay components 405. The delay chain 500 includes an input node 505 that may receive an input signal, IN, and an output node 510 that may generate an output signal, OUT, that is delayed relative to the input signal. In some examples, the input signal may refer to an access command signal (e.g., from a host device 105, from a device memory controller 155), or a timing signal that is otherwise generated at a memory device 110 or memory die 200 in response to an access command. In some examples, the output signal may refer to an access timing signal (e.g., for initiating an operation 305), or may refer to a timing signal provided to a subsequent delay component 405, or delay chain or portion thereof, that is outside a calibration chain 315 that supports one or more different operations 305 of a timing chain 300.

The delay chain 500 may be operated in a ring oscillator configuration, which may be enabled by a switching component 515. For example, when a signal OSCEn is enabled, a feedback from a node M (e.g., a second node of the delay chain 500 or ring oscillator configuration), and through a pulse component 525 via a node P, may be returned to the first delay component 405-a-1 via the switching component 515 (e.g., at a node A, a first node of the delay chain 500 or ring oscillator configuration). When a signal OSCEn is disabled, the feedback via node P may be disabled (e.g., disabling or inhibiting an output of the pulse component from being generated at or conveyed to node A). Thus, the signal OSCEn may be associated with toggling the delay chain 500 between a native mode (e.g., for generating timing signals to initiate operations 305) and an oscillator mode (e.g., to support a calibration of one or more delay components 405, which may include the delay components 405-a of the delay chain 500 or other delay components 405 outside the delay chain 500).

The pulse component 525 may be coupled between the node M and the node A, and may be configured to generate a pulse signal upon a transition in the signal at node M (e.g., a signal transition direction, such as either a rising edge or a falling edge). For example, upon a rising edge of a signal at node M, or a voltage at node M otherwise satisfying a threshold voltage, the pulse component 525 may generate a pulse signal at node P, which may include a falling edge at the node P followed by a rising edge at the node P. In some examples, the pulse component 525 may be referred to as a one shot pulse component. The pulse signal may be configured with a particular pulse width, such as a seven-gate one shot pulse, which may effectively reset the ring oscillator signaling.

When operating in a ring oscillator configuration (e.g., for a calibration operation), a quantity of cycles of the ring oscillator, corresponding to a quantity of cycles of the signal Osc, may be counted or accumulated by a counter 530. In various examples, the counter 530 may be a component of a memory die 200 that includes the delay chain 500, or the counter 530 may be a component of a memory device 110 or host device 105 in communication with such a memory die 200, or the counter 530 may be a component of an external calibration device otherwise in communication with the delay chain 500. The counter 530 may be a bitwise counter having a configured capacity according to a quantity of bits (e.g., a 10-bit counter having a capacity to count 512 cycles of the ring oscillator configuration). In some examples, the capacity of the counter 530 may correspond to a quantity of cycles expected over a configured calibration duration.

The delay components 405-a, individually or in aggregate, may be associated with a target delay duration that supports a given timing chain 300. Accordingly, in some examples, the ring oscillator configuration of the delay chain 500 may be cycled over a calibration duration, and the calibration duration may be divided by a quantity of cycles counted to determine an actual delay associated with the delay components 405-a-1 through 405-a-n. The actual delay may be compared with the target delay duration to identify whether one or more of the delay components 405-a should be calibrated or reconfigured. If the actual delay duration is too long, or too few counts of the cycled ring oscillator are accumulated at the counter 530, one or more of the delay components 405-a may be calibrated in a manner that shortens the respective delays (e.g., via an impedance calibration signal 425). If the actual delay duration is too short, or too many counts of the cycled ring oscillator are accumulated at the counter 530, one or more of the delay components 405-a may be calibrated in a manner that lengthens the respective delays. Such a process may be repeated at other operating conditions to identify an actual slope relative to an operating condition, and based on a comparison to a target slope relative to the operating condition, one or more of the delay components 405-a may be calibrated in a manner that increases or decreases the slope of delay duration relative to the operating condition (e.g., via a slope calibration signal 435). Delay components 405-a-1 through 405-a-n may be adjusted or reconfigured until a quantity of cycles, or a delay duration, or a variability relative to an operating condition matches or is minimally separated from a target.

In some examples, a timing signal at the output node 510 may be generated based at least in part on a pulse delay replica component 540, which may replicate or approximate a delay introduced by the pulse component 525. For example, when the delay chain 500 is operated in a ring oscillator configuration for a calibration operation, a cycle of the ring oscillator may include an overhead duration related to the pulse component 525. To compensate for such overhead, the pulse delay replica component 540 may be included to compensate for such an overhead in the generation of timing signals associated with an operation 305. However, in some examples (e.g., when overhead associated with a pulse component 525 is relatively small), a pulse delay replica component 540 may be omitted, in which case a signal of the output node 510 may be equivalent to a signal at the node M.

Figure 6:
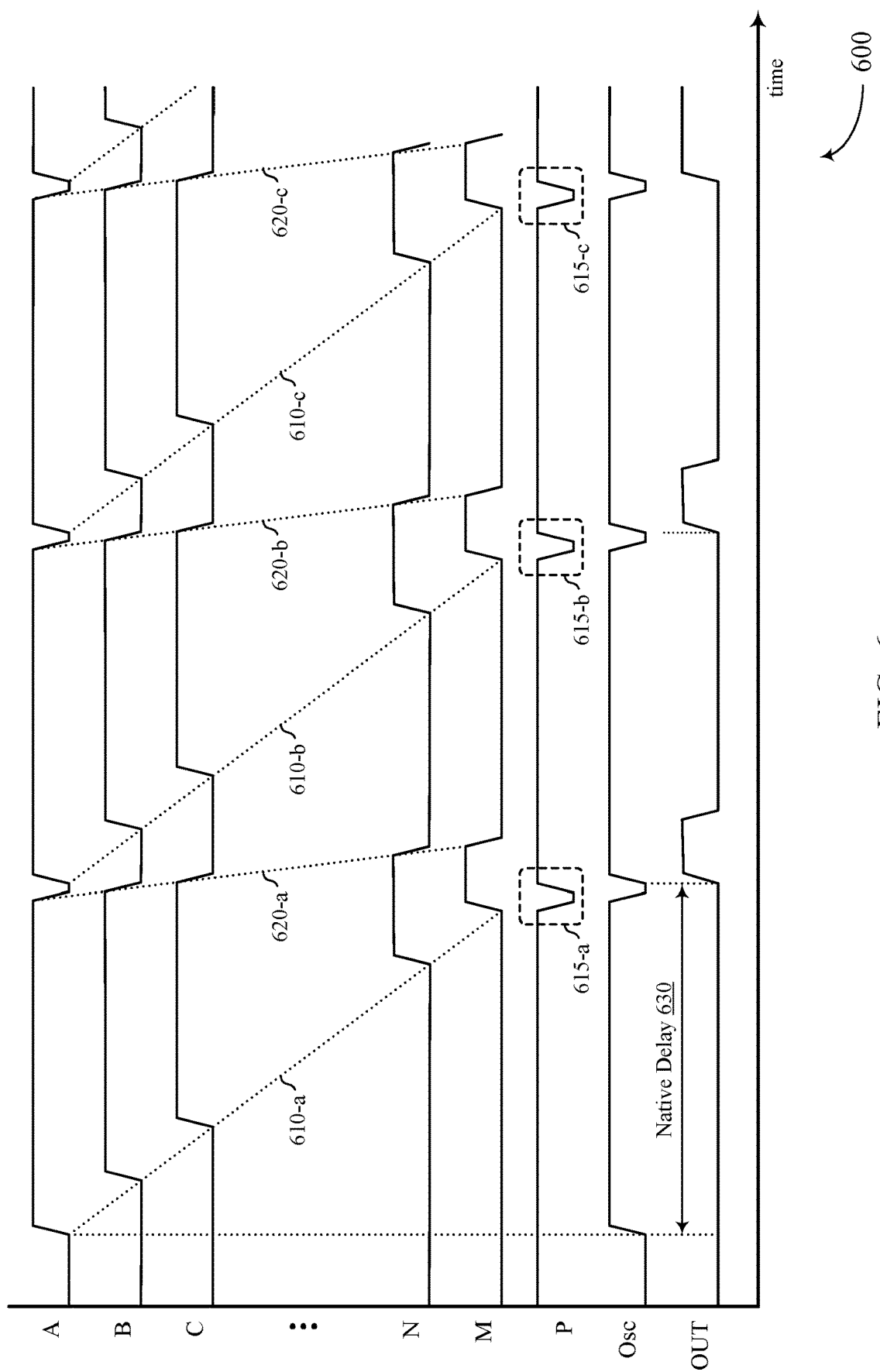
FIG. 6 illustrates an example of a signal propagation that supports delay calibration oscillators for a memory device in accordance with examples as disclosed herein.

FIG. 6 illustrates an example of a signal propagation 600 that supports delay calibration oscillators for a memory device in accordance with examples as disclosed herein. The signal propagation 600 may illustrate signaling at various nodes of the delay chain 500 while cycling the delay chain 500 in a ring oscillator configuration.

The signal propagation 600 may be initiated with a positive input signal, IN, applied to the input node 505, and the ring oscillator configuration being enabled by applying a positive signal, OSCEn, at the switching node 520. Thus, a rising edge may be generated at node A, as an input signal 410 to the delay component 405-a-1. A rising edge may be generated by the delay component 405-a-1 at node B, as an output signal 415 of the delay component 405-a-1, having a relative delay compared to the rising edge at node A. A propagation of rising edges may be similarly passed through delay components 405-a-2 through 405-a-n to Node M, as an output signal 415 of the delay component 405-a-n. The propagation of rising edges through the delay components 405-a of the delay chain may be associated with a rising edge delay propagation 610-a.

In response to the rising edge at node M (e.g., associated with an input to the pulse component 525), the pulse component 525 may generate a pulse signal 615-a (e.g., a one shot pulse) at the node P. In the example of signal propagation 600, a pulse signal 615 may include, in response to a rising edge at node M or a signal at node M otherwise satisfying a threshold, a falling edge at the node P followed by a rising edge at the node P. The pulse component 525 may be configured to generate the pulse signal with a pulse width, such as a pulse width of some quantity of gate delays (e.g., seven gate delays). The pulse signal 615-a may be passed through the switching component 515, which may not impose a significant delay, and the propagated pulse signal may be received at the counter 530 as a signal, Osc. The counter 530 may increment an accumulated count based on a rising edge, a falling edge, or a combination thereof, of the signal, Osc.

The falling edge of the pulse signal passed to node A may be propagated through delay components 405-a-1 through 405-a-n with successive falling edge delays associated with a falling edge delay propagation 620-a, which may be a faster propagation than a rising edge delay propagation 610 when the delay components 405-a are configured with a rising edge delay that is longer than a falling edge delay. The rising edge of the pulse signal passed to node A may also be propagated through delay components 405-a-1 through 405-a-n with successive rising edge delays associated with another rising edge delay propagation 610-b, causing the pulse component 525 to generate another pulse signal 615-b. These aspects of signal propagation may continue during a duration over which the ring oscillator configuration is cycled, supporting the counter 530 accumulating some quantity of counts corresponding to a quantity of pulse signals 615 generated during the cycling.

By including the pulse component 525 to generate pulse signals 615, the ring oscillator configuration of the delay chain 500 may support a more accurate calibration of the delay chain 500 (e.g., for calibrating rising edge delays of the delay components 405-a, which may be more relevant to the accuracy of timing signals for initiating operations 305 according to a timing chain 300). For example, if the pulse component 525 was omitted (e.g., and replaced with an inverter in an alternative ring oscillator configuration), a transition in the feedback signal from node M, such as a rising edge at node M, may need to be inverted and passed back through the delay components 405-a (e.g., in a reset path) to complete a cycle of the ring oscillator. In such a case, the signal propagation may accumulate falling edge delays before generating a subsequent rising edge (e.g., at node A), which may not be relevant to calibration of rising edge delays associated with generating timing signals for operations 305. In one example, the delay components 405-*a* may be associated with a 4-gate falling edge delay, such that an alternative ring oscillator configuration that omits the pulse component 525 may accumulate an overhead delay of 4*N+1 gates delay per oscillator cycle, which may impair a granulation for calibrating rising edge delays. Thus, a pulse component 525 may be advantageously included in the ring oscillator configuration of the delay chain 500 to effectively reset the ring oscillator, and reduce or eliminate overhead associated with falling edge delays of the delay components 405-*a*.

In some examples, including a pulse component 525 may not entirely eliminate delay overhead (e.g., delays unrelated to rising edge delays meant to be calibrated). For example, when the pulse component 525 is configured to generate a pulse signal having a pulse width of 7 gate delays, those 7 gate delays may represent an overhead relative to the calibration of rising edge delays of the delay components 405. Such an overhead incurred by the pulse component 525 may be substantially lower than an overhead introduced by falling edge delays in a ring oscillator configuration that omits a pulse component 525. However, it may be further advantageous to account for such overhead of the pulse component 525 for generating timing signals corresponding to operations 305.

As illustrated in the example of delay chain 500, a pulse delay replica component 540 may be included between a node of the ring oscillator configuration and a node associated with generating a timing signal for initiating an operation 305. For example, the pulse delay replica component 540 may be coupled between the node M and the output node 510, and may be configured to generate an output signal (e.g., OUT) having a delay, relative to an input signal (e.g., at the node M), that is equal to or otherwise approximates a delay introduced by the pulse component 525. Accordingly, by including the pulse delay replica component 540, the delay chain 500 may be configured to generate an output signal, OUT, having a native delay 630 relative to the input signal (e.g., IN, or a signal at node A) that is equal to the period of the ring oscillator configuration (e.g., a period of the signal Osc), thereby compensating for delay overhead of the ring oscillator configuration that may be related to the pulse component 525.

In some examples, other nodes of the delay chain 500 may support generating timing signals for initiating operations 305. For example, when the delay chain 500 is associated with the calibration chain 315-*a* described with reference to FIG. 3A, node B may be associated with generating a timing signal to initiate the operation 305-*a*-2, node C may be associated with generating a timing signal to initiate the operation 305-*a*-3, and node M or the output node 510 may be associated with generating a timing signal to initiate the operation 305-*a*-4. In various examples, additional pulse delay replica components 540, not shown in the example of delay chain 500, may be included between the respective nodes of the delay chain 500 and components that receive the timing signals to initiate the respective operations 305. In some examples, nodes between ones of the delay components 405-*a*-1 through 405-*a*-*n* may be associated with a scaled pulse delay replica component 540, where a corresponding delay is some fraction of the delay incurred by the pulse component 525. For example, a replica delay added to node B for initiating operation 305-*a*-2 may be 20% of the delay incurred by pulse component 525, a replica delay added to node C for initiating operation 305-*a*-3 may be 50% of the delay incurred by pulse component 525, and a replica delay added to node M for initiating operation 305-*a*-4 may be 100% of the delay incurred by pulse component 525.

Thus, according to these and other examples, a memory device 110 or memory die 200 may include a delay chain (e.g., corresponding to a calibration chain 315), operable in a ring oscillator configuration, that supports the calibration of delay components 405 having configurable delays or durations by way of a stored configuration of the delay components 405. A delay chain corresponding to a timing chain 300, which may or may not include the calibration chain 315, may generate timing signals for initiating operations 305 (e.g., in response to an access command) with relative timing that is based at least in part on the stored configuration.

Figure 7:
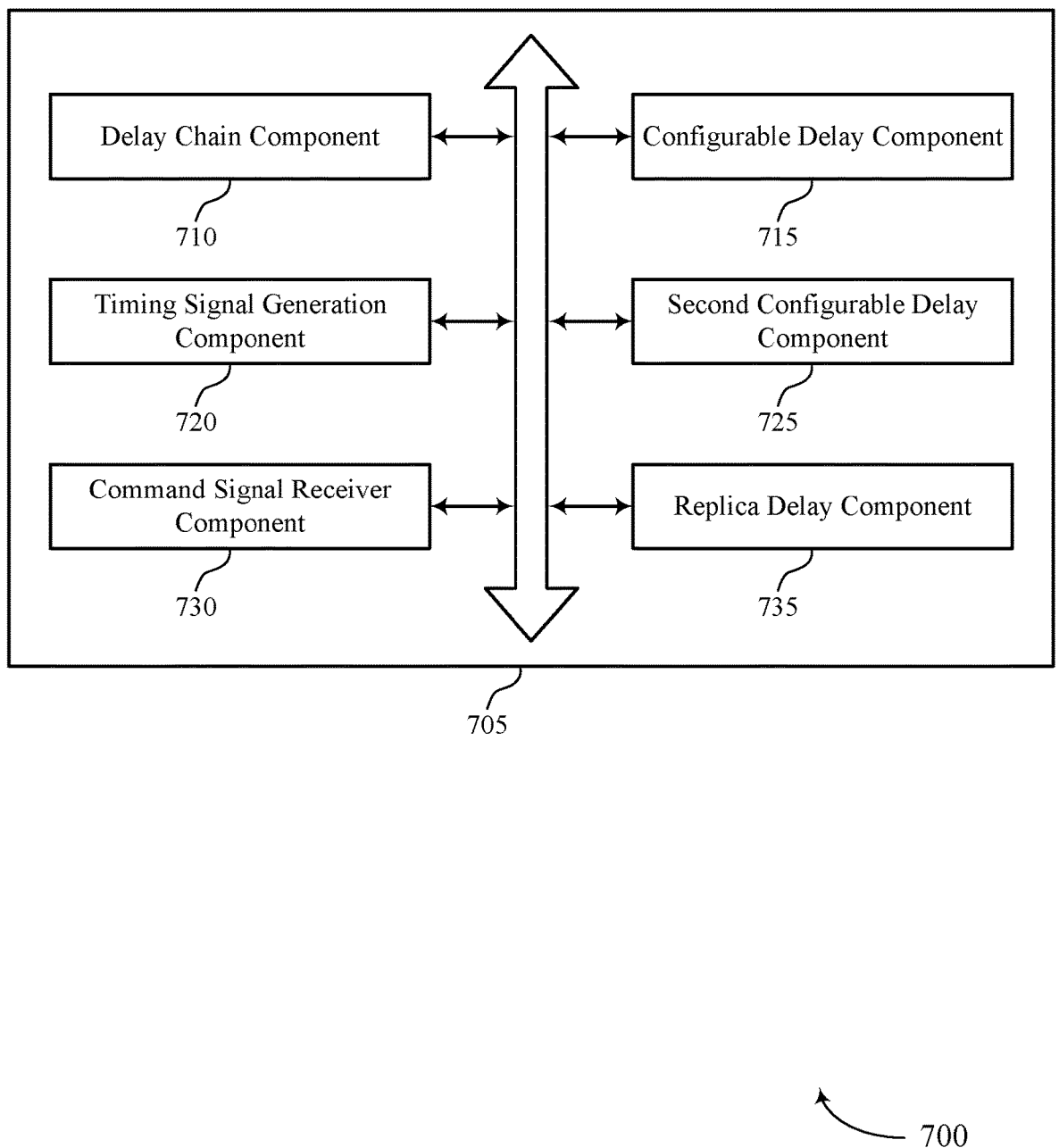
FIG. 7 shows a block diagram of a memory device that supports delay calibration oscillators for a memory device in accordance with examples as disclosed herein.

FIG. 7 shows a block diagram 700 of a memory device 705 that supports delay calibration oscillators for a memory device in accordance with examples as disclosed herein. The memory device 705 may be an example of aspects of a memory device as described with reference to FIGS. 1 through 6. The memory device 705 may include a delay chain component 710, a configurable delay component 715, a timing signal generation component 720, a second configurable delay component 725, a command signal receiver component 730, and a replica delay component 735. Each of these modules may communicate, directly or indirectly, with one another (e.g., via one or more buses).

The delay chain component 710 may include a set of one or more delay components, each of which may generate an output signal that is delayed relative to an input signal. In some examples, the delay chain component may be cycled, which may include receiving a signal at a first node of the delay chain component, generating, at each delay component of the set of delay components, a respective output signal that is delayed relative to a respective input signal, generating a pulse signal based on the respective output signal of a last delay component of the delay chain component, incrementing a value of a counter based on generating the pulse signal, and sending the generated pulse signal to the first node.

The configurable delay component 715 may store a configuration for the delay chain, the configuration associated with configuring a variable duration of the delay chain.

In some examples, the configurable delay component 715 may configure a delay duration of each delay component of the set of delay components.

In some examples, the configurable delay component 715 may configure a slope of a delay duration, relative to a temperature of the memory device, of each delay component of the set of delay components.

The timing signal generation component 720 may generate a timing signal for accessing a memory array of the memory device, the timing signal having a timing that is based on the configuration for the delay chain (e.g., stored at the configurable delay component 715).

In some examples, the timing signal generation component 720 may generate the timing signal for the accessing the memory array with a second delay relative to the second signal, the second delay based on the configuration for the delay chain (e.g., stored at the configurable delay component 715).

In some examples, the timing signal generation component 720 may generate the timing signal, via a node of the delay chain between the first node and the last delay component of the delay chain, with a delay that is based on a subset of the set of delay components.

The second configurable delay component 725 may store a second configuration for the delay chain component 710, the second configuration associated with configuring a second variable duration of the delay chain component 710, where the timing signal has a timing that is based on the second configuration for the delay chain component 710.

The command signal receiver component 730 may receive, at the first node, a second signal based on an access command.

The replica delay component 735 may generate the timing signal based on a replica delay component configured with a replica delay duration corresponding to a duration of the pulse signal.

Figure 8:
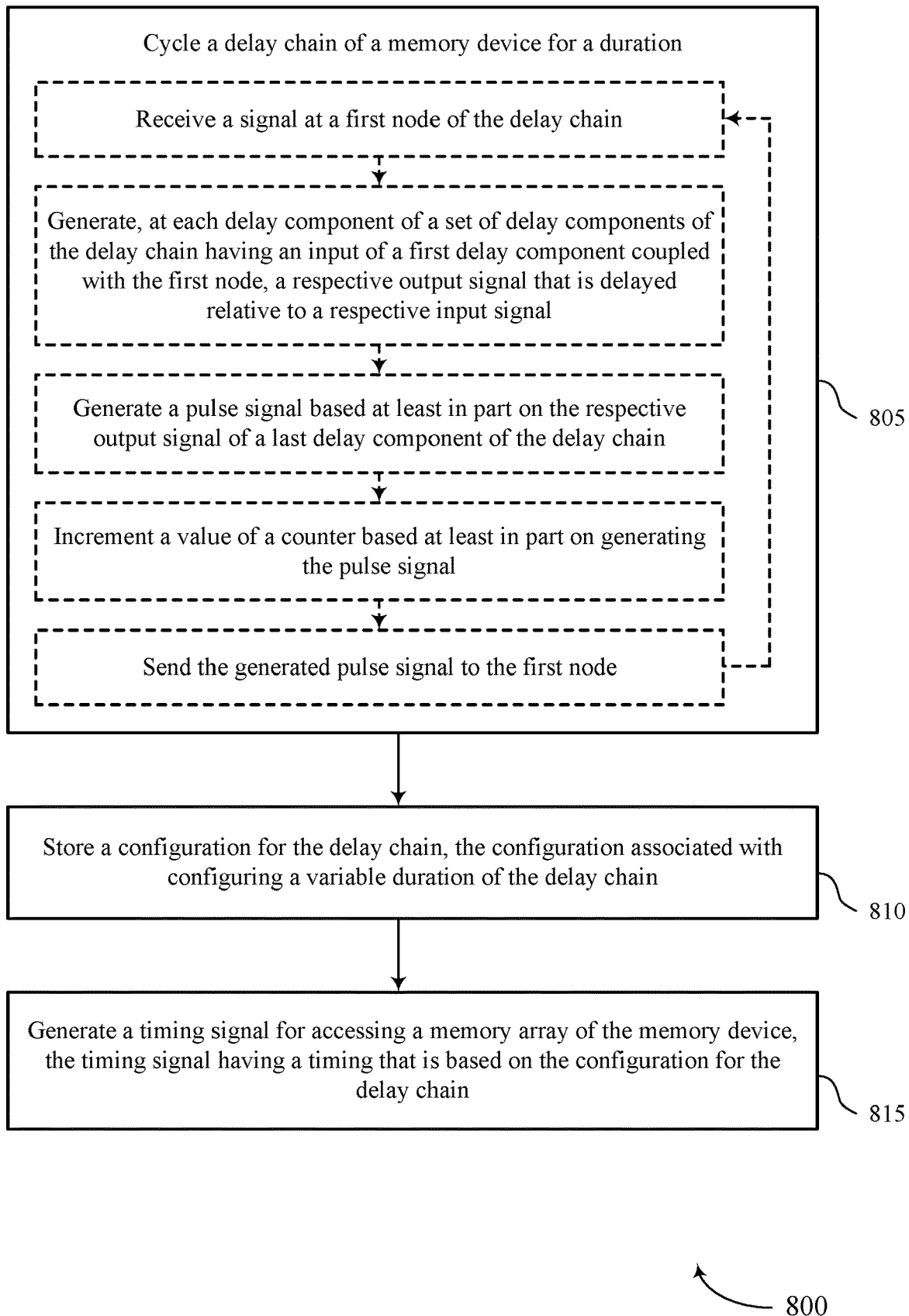
FIG. 8 shows a flowchart illustrating a method or methods that support delay calibration oscillators for a memory device in accordance with examples as disclosed herein.

FIG. 8 shows a flowchart illustrating a method or methods 800 that supports delay calibration oscillators for a memory device in accordance with aspects of the present disclosure. The operations of method 800 may be implemented by a memory device or its components as described herein. For example, the operations of method 800 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 805, the memory device may cycle a delay chain of a memory device for a duration. In some examples, cycling the delay chain may include receiving a signal at a first node of the delay chain, generating, at each delay component of a set of delay components of the delay chain having an input of a first delay component coupled with the first node, a respective output signal that is delayed relative to a respective input signal, generating a pulse signal based at least in part on the respective output signal of a last delay component of the delay chain, incrementing a value of a counter based at least in part on generating the pulse signal, and sending the generated pulse signal to the first node. The operations of 805 may be performed according to the methods described herein. In some examples, aspects of the operations of 805 may be performed by a delay chain component as described with reference to FIG. 7.

At 810, the memory device may store a configuration for the delay chain, the configuration associated with configuring a variable duration of the delay chain. The operations of 810 may be performed according to the methods described herein. In some examples, aspects of the operations of 810 may be performed by a configurable delay component as described with reference to FIG. 7.

At 815, the memory device may generate a timing signal for accessing a memory array of the memory device, the timing signal having a timing that is based on the configuration for the delay chain. The operations of 815 may be performed according to the methods described herein. In some examples, aspects of the operations of 815 may be performed by a timing signal generation component as described with reference to FIG. 7.

In some examples, an apparatus as described herein may perform a method or methods, such as the method 800. The apparatus may include features, circuitry, means, or instructions (e.g., a non-transitory computer-readable medium storing instructions executable by a processor) for cycling a delay chain of a memory device for a duration, storing a configuration for the delay chain, the configuration associated with configuring a variable duration of the delay chain, and generating a timing signal for accessing a memory array of the memory device, the timing signal having a timing that is based on the configuration for the delay chain. In some examples, for cycling the delay chain, the apparatus may include features, circuitry, means, or instructions for receiving a signal at a first node of the delay chain, generating, at each delay component of a set of delay components of the delay chain having an input of a first delay component coupled with the first node, a respective output signal that is delayed relative to a respective input signal, generating a pulse signal based at least in part on the respective output signal of a last delay component of the delay chain, incrementing a value of a counter based at least in part on generating the pulse signal, and sending the generated pulse signal to the first node.

Some examples of the method 800 and the apparatus described herein may further include operations, features, circuitry, means, or instructions for storing a second configuration for the delay chain of the memory device, the second configuration associated with configuring a second variable duration of the delay chain, where the timing signal has a timing that is based on the second configuration for the delay chain.

In some examples of the method 800 and the apparatus described herein, storing the configuration for the delay chain may include operations, features, circuitry, means, or instructions for configuring a delay duration of each delay component of the set of delay components.

In some examples of the method 800 and the apparatus described herein, storing the configuration for the delay chain may include operations, features, circuitry, means, or instructions for configuring a slope of a delay duration, relative to a temperature of the memory device, of each delay component of the set of delay components.

Some examples of the method 800 and the apparatus described herein may further include operations, features, circuitry, means, or instructions for receiving, at the first node, a second signal based on an access command, and generating the timing signal for the accessing the memory array with a second delay relative to the second signal, the second delay based on the configuration for the delay chain.

In some examples of the method 800 and the apparatus described herein, generating the timing signal may include operations, features, circuitry, means, or instructions for generating the timing signal, via a node of the delay chain between the first node and the last delay component of the delay chain, with a delay that is based on a subset of the set of delay components.

In some examples of the method 800 and the apparatus described herein, generating the timing signal may include operations, features, circuitry, means, or instructions for generating the timing signal based on a replica delay component configured with a replica delay duration corresponding to a duration of the pulse signal.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a delay chain of a memory device, the delay chain including a set of delay components coupled between a first node and a second node and configured to generate a signal, at the second node, having a delay relative to the signal at the first node, a pulse component coupled between the second node and the first node and configured to generate a pulse in the signal at the first node based on the signal at the second node satisfying a threshold, and a counter coupled with the second node and configured to count a quantity of cycles of the signal.

Some examples of the apparatus may include a switching component configured to selectively enable or inhibit generating the pulse in the signal at the first node based on an operating mode of the memory device.

In some examples, each delay component of the set of delay components includes a configurable delay component for configuring a respective delay duration.

In some examples, at least one delay component of the set of delay components may be associated with a respective delay duration that is based on a temperature of the memory device.

In some examples, the at least one delay component of the set of delay components includes a configurable delay component for configuring a slope of the respective delay duration relative to the temperature of the memory device.

Some examples of the apparatus may include a second set of delay components coupled between the second node and a third node of the delay chain and configured to generate a signal, at the third node, having a second delay relative to the signal at the second node, and each delay component of the second set of delay components may include a configurable delay component for configuring a respective delay duration.

In some examples, the delay chain may be configured to receive, at the first node, a second signal based on an access command, and generate an access operation timing signal having a second delay relative to the second signal, the second delay based on at least one of the set of delay components.

In some examples, the delay chain may include a replica delay component, coupled between the second node and a fourth node of the delay chain, the replica delay component configured with a replica delay duration corresponding to a delay duration of the pulse component, and the delay chain may be configured to generate the access operation timing signal at the fourth node and having the second delay based on the set of delay components and the replica delay component.

In some examples, the delay chain may be configured to generate the access operation timing signal at the second node and having the second delay based on the set of delay components.

In some examples, the delay relative to the signal at the first node may be based on a time constant property of passive circuit elements of the set of delay components.

In some examples, at least one of the set of delay components may be configured for a first delay to a first signal transition direction and a second delay to a second signal transition direction that is different than the first delay.

In some examples, the at least one of the set of delay components may be operable to configure the first delay separately from the second delay.

In some examples, the pulse component may be configured to generate the pulse in the signal at the first node based on a signal transition direction of the signal at the second node.

In some examples, the delay chain may be associated with a first type of access operation, and the apparatus may include a second delay chain of the memory device associated with a second type of access operation, the second delay chain including a second set of delay components coupled between a third node and a fourth node and configured to generate a signal, at the fourth node, having a second delay relative to the signal at the third node.

In some examples, each delay component of the second set of delay components may include a configurable delay component for configuring a respective delay duration, and the set of delay components may be associated with a delay duration that is proportional to a temperature of the apparatus, and the second set of delay components may be associated with a delay duration that is inversely proportional to the temperature of the apparatus.

Some examples of the apparatus may include a second pulse component coupled between the fourth node and the third node and configured to generate a pulse in the signal at the third node based on the signal at the fourth node satisfying a second threshold, a second counter coupled with the fourth node and configured to count a quantity of cycles of the signal at the fourth node, and the second delay chain may include one or more delay components having a configurable delay component for configuring a respective delay duration.

Another apparatus is described. The apparatus may include a memory array including a set of memory cells, a delay chain configured for generating a timing signal for accessing the memory array with a timing that is based on a set of one or more delay components of the delay chain, a pulse component coupled to an output of the set of one or more delay components and configured to generate a pulse for input to the delay chain based on a transition of an output of the delay chain, and a controller coupled with the delay chain. The controller may be operable to cycle the delay chain for a duration, increment a value of a counter based at least in part on the transition of the output of the delay chain, store a configuration for the delay chain, the configuration associated with configuring a variable duration of the delay chain, and generate the timing signal for accessing the memory array having a timing that is based at least in part on the configuration for the delay chain.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a delay chain of a memory device, the delay chain comprising a first node and a second node and operable to generate a signal at the second node such that transitions of the signal at the second node are delayed relative to transitions of a signal at the first node;
a pulse component operable to generate pulses in the signal at the first node based at least in part on the signal at the second node; and
a counter operable to count a quantity of cycles of a signal associated with the delay chain that is based at least in part on the generated pulses.

2. The apparatus of claim 1, wherein the delay chain comprises a configurable impedance operable to adjust a duration of a delay between a transition of the signal at the first node and a transition of the signal at the second node.

3. The apparatus of claim 1, wherein the delay chain comprises a delay component operable to adjust a relationship between a duration of a delay, between a transition of the signal at the first node and a transition of the signal at the second node, and a temperature of the memory device, or a voltage of the memory device, or a combination thereof.

4. The apparatus of claim 1, wherein, to generate the pulses in the signal at the first node, the pulse component is configured to generate a rising edge and a falling edge of a voltage at the first node based at least in part on a rising edge of a voltage at the second node, or is configured to generate a rising edge and a falling edge of a voltage at the first node based at least in part on a falling edge a voltage at the second node.

5. The apparatus of claim 1, wherein the quantity of cycles corresponds to a quantity of rising edges or a quantity of falling edges of the signal associated with the delay chain during operation of the delay chain in a ring oscillator configuration that is based at least in part on the generated pulses.

6. The apparatus of claim 1, wherein the delay chain is configured to generate the signal at the second node such that rising edges of the signal at the second node are delayed relative to respective rising edges of the signal at the first node, and such that falling edges of the signal at the second node are delayed relative to respective falling edges of the signal at the first node.

7. The apparatus of claim 1, further comprising:
a switching component operable to enable or inhibit the generated pulses in the signal at the first node based at least in part on an operating mode of the memory device.

8. The apparatus of claim 1, further comprising circuitry operable to:
generate a transition of the signal at the first node based at least in part on receiving a command to access the memory device; and
perform an access operation of the memory device based at least in part on a transition of the signal at the second node that is delayed, at least in part by the delay chain, relative to the generated transition of the signal at the first node.

9. The apparatus of claim 8, wherein:
the delay chain further comprises a delay component between the second node and a third node of the delay chain, the delay component configured with a delay duration corresponding to a delay associated with the generated pulses; and
the circuitry is operable to perform the access operation based at least in part on the delay duration.

10. A method, comprising:
cycling a delay chain of a memory device for a duration, wherein cycling the delay chain comprises:
generating a transition in a signal at a second node of the delay chain that is delayed relative to a transition in the signal at a first node of the delay chain; and
generating a pulse in the signal at the first node based at least in part on the transition in the signal at the second node;
counting a quantity of transitions, during the duration, of a signal associated with the delay chain that is based at least in part on the cycling; and
configuring a delay component of the delay chain based at least in part on the quantity of transitions during the duration.

11. The method of claim 10, further comprising:
performing an access operation of the memory device based at least in part on the configured delay component of the delay chain.

12. The method of claim 10, wherein configuring the delay component comprises:
configuring a variable impedance of the delay component operable to adjust a duration of a delay, between a transition of a signal at an input of the delay component and a transition of a signal at an output of the delay component, based at least in part on the quantity of transitions during the duration of the cycling.

13. The method of claim 10, wherein configuring the delay component comprises:
configuring a relationship between a duration of a delay, between a transition of a signal at an input of the delay component and a transition of a signal at an output of the delay component, and a temperature of the memory device, or a voltage of the memory device, or a combination thereof based at least in part on the quantity of transitions during the duration of the cycling.

14. The method of claim 10, wherein configuring the delay component comprises:
comparing a delay that is determined based at least in part on the counted quantity of transitions to a target delay duration; and
configuring the delay component based at least in part on the comparison.

15. The method of claim 10, wherein counting the quantity of transitions during the duration comprises:
counting a quantity of rising edges in a voltage at the first node, or counting a quantity of falling edges in a voltage at the first node.

16. The method of claim 10, wherein generating the pulse in the signal at the first node comprises:
generating a rising edge and a falling edge in a voltage at the first node based at least in part on a rising edge of a voltage at the second node, or generating a rising edge and a falling edge in a voltage at the first node based at least in part on a falling edge of a voltage at the second node.

17. An apparatus, comprising:
a memory array;
a delay chain operable to generate timing signals for accessing the memory array; and
circuitry operable to:

cycle the delay chain in a ring oscillator configuration for a duration, wherein the cycling comprises:
  generating a transition in a signal at a second node of the delay chain that is delayed relative to a transition in a signal at a first node of the delay chain; and
  generating a pulse in the signal at the first node based at least in part on the transition in the signal at the second node;
count a quantity of transitions, during the duration, of a signal associated with the delay chain that is based at least in part on the cycling;
configure a delay component of the delay chain based at least in part on the quantity of transitions during the duration; and
perform an access operation on the memory array based at least in part on the configured delay component.

18. The apparatus of claim 17, wherein the circuitry is operable to:
  determine a delay associated with the delay chain based at least in part on the quantity of transitions during the duration;
  compare the determined delay with a target delay duration based at least in part on determining the delay; and
  configure the delay component based at least in part on the comparison.

19. The apparatus of claim 17, wherein the circuitry is operable to:
  configure a variable impedance of the delay component operable to adjust a duration of a delay, between a transition of a signal at an input of the delay component and a transition of a signal at an output of the delay component, based at least in part on the counted quantity of transitions during the duration of the cycling.

20. The apparatus of claim 17, wherein the circuitry is operable to:
  configure a relationship between a duration of a delay, between a transition of a signal at an input of the delay component and a transition of a signal at an output of the delay component, and a temperature of the apparatus, or a voltage of the apparatus, or a combination thereof based at least in part on the counted quantity of transitions during the duration of the cycling.

* * * * *